United States Patent
Terakado et al.

[11] Patent Number: 6,129,255
[45] Date of Patent: Oct. 10, 2000

[54] WIRE BONDING APPARATUS

[75] Inventors: Yoshimitsu Terakado, Hachioji; Kazumasa Sasakura, Tachikawa; Shigeru Shiozawa, Musashimurayama, all of Japan

[73] Assignee: Kabushiki Kaisha Shinkawa, Tokyo, Japan

[21] Appl. No.: 09/503,428

[22] Filed: Feb. 14, 2000

[30] Foreign Application Priority Data

Feb. 15, 1999 [JP] Japan .................................. 11-035283

[51] Int. Cl.[7] .............................. B23K 1/06; B23K 3/00
[52] U.S. Cl. ..................... 228/4.5; 219/56.1; 219/85.18
[58] Field of Search ................... 228/4.5, 904; 219/56.1, 219/85.18

[56] References Cited

U.S. PATENT DOCUMENTS 3,806,019  4/1974  Diepeveen .
5,031,821  7/1991  Kaneda et al. .
5,433,371  7/1995  Morisako .
5,653,380  8/1997  Haji .
5,667,130  9/1997  Morita et al. .
5,676,856  10/1997  Haji et al. .

FOREIGN PATENT DOCUMENTS 1-58861  12/1989  Japan .
9-205110  8/1997  Japan .

*Primary Examiner*—Patrick Ryan
*Assistant Examiner*—Collun P. Cooke
*Attorney, Agent, or Firm*—Koda & Androlia

[57] ABSTRACT

A bonding apparatus comprising a capillary through which a wire passes, a torch electrode that makes a substantially horizontal pivotal movement so as to be brought under the capillary, and a rotary motor that drives the torch electrode, thus allowing the torch electrode to have any desired range of movement so as to provide superior working characteristics.

3 Claims, 2 Drawing Sheets

WIRE BONDING APPARATUS

BACKGROUND OF THE INVENTION

1. Field of the Invention

The present invention relates to a wire bonding apparatus and more particularly to a wire bonding apparatus that is equipped with a movable torch electrode.

2. Prior Art

In movable torch electrode systems, a torch electrode is moved horizontally. The torch electrode is moved and positioned beneath the tip end of a wire that extends out of the tip end of a capillary. The electrode is caused to discharge so as to form a ball at the end of the wire. When the ball is formed once, the torch electrode is withdrawn from beneath the capillary.

Examples of wire bonding apparatus equipped with a movable torch electrode of this type are described in Japanese Patent Application Publication (Kokoku) No. H1-58861 and Japanese Patent Application Laid-Open (Kokai) No. H9-205110.

In Japanese Patent Application Publication (Kokoku) No. H1-58861, the movable electrode is horizontally provided beneath the capillary through which a wire passes so that a ball is formed at the end of the wire by electrical arc effected by the movable electrode.

In Japanese Patent Application Laid-Open (Kokai) No. H9-205110, the movable torch electrode system comprises a horizontal actuating arm to which a torch electrode is installed so that the horizontal actuating arm is moved horizontally, a spring which pulls this horizontal actuating arm toward the area beneath the capillary, a stopper which positions the horizontal actuating arm beneath the capillary, and an actuator that is a solenoid and drives the horizontal actuating arm so that the torch electrode is withdrawn from beneath the capillary.

When the solenoid is switched on, the horizontal actuating arm is pulled by the magnetic force of the solenoid, and the arm is withdrawn from beneath the capillary. When the solenoid is switched off, the horizontal actuating arm is caused to move beneath the capillary by the driving force of the spring and stops when the arm comes into contact with the stopper.

In this prior art, the torch electrode is stopped by being brought into contact with the stopper. Accordingly, noise is generated, and dust is likely caused by wear. Furthermore, the range of movement of the torch electrode is limited by the solenoid and stopper. Thus, there is no degree of freedom in the position of the torch electrode, and the torch electrode becomes an obstruction, resulting in poor working characteristics so that passing the wire through the capillary and replacing the capillary cannot be done easily. Furthermore, since the system uses a spring and solenoid, high-speed operation cannot be achieved.

SUMMARY OF THE INVENTION

Accordingly, the object of the present invention is to provide a wire bonding apparatus which is superior in terms of quiet operation, in which the degree of freedom of the range of movement of the torch electrode is high so as to provide superior working characteristics, and in which high-speed operation is achieved.

The above object is accomplished by a unique structure for a wire bonding apparatus that is equipped with a capillary through which a wire is passed, a torch electrode which is installed so as to move substantially horizontal and be positioned beneath the capillary, and a torch electrode driving means that drives the torch electrode; and in the present invention, the torch electrode driving means is a rotary motor.

In the above structure, the torch electrode is operated directly by the rotary motor.

DETAILED DESCRIPTION OF THE PREFERRED EMBODIMENTS

Figure 1:
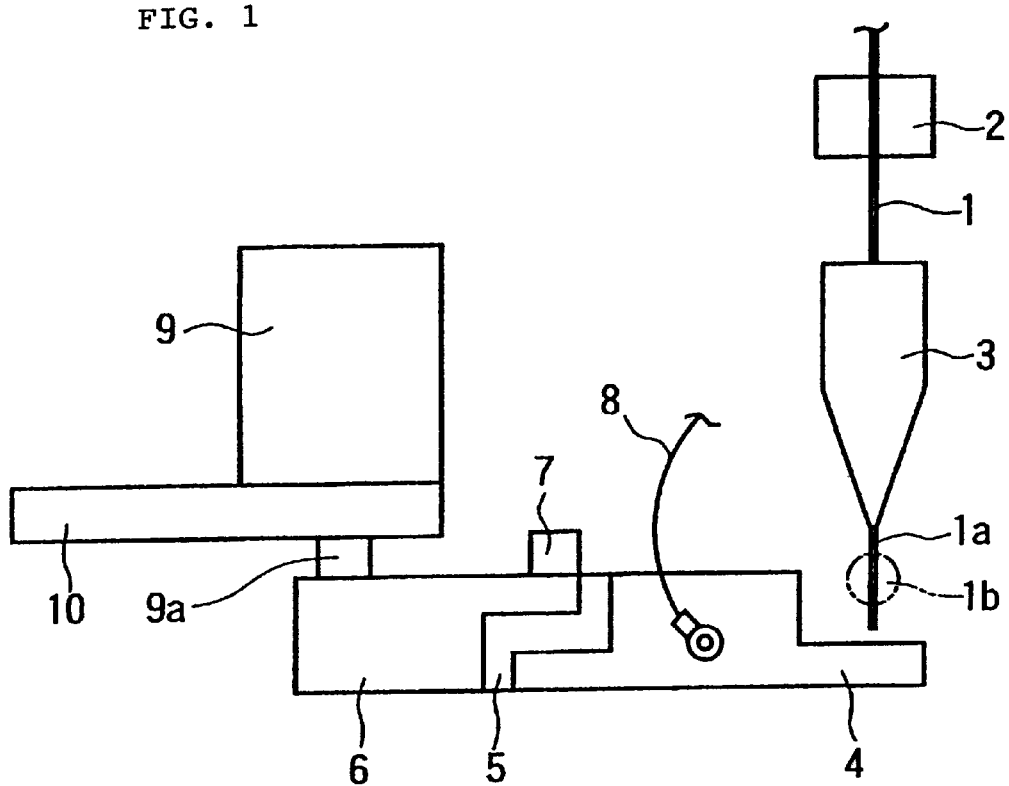
FIG. 1 is a front view of one embodiment of the wire bonding apparatus according to the present invention.

One embodiment of the present invention will be described with reference to FIGS. 1 and 2.

In this embodiment, a wire 1 passing through a damper 2 is brought into a capillary 3. A torch electrode 4 is fastened to a torch electrode holding member 6 by a fastening screw 7 with an insulating member 5 in between. The torch electrode holding member 6 is attached to the output shaft 9a of a rotary motor 9, and this rotary motor 9 is fastened to a bonding head (not shown) via a motor supporting member 10. The rotary motor 9 is, for instance, a pulse motor, and the output shaft 9a is vertically oriented. The torch electrode 4 is connected to a high-voltage power supply (not shown) via a high-voltage output line 8.

Next, the operation of the embodiment will be described.

Figure 2:
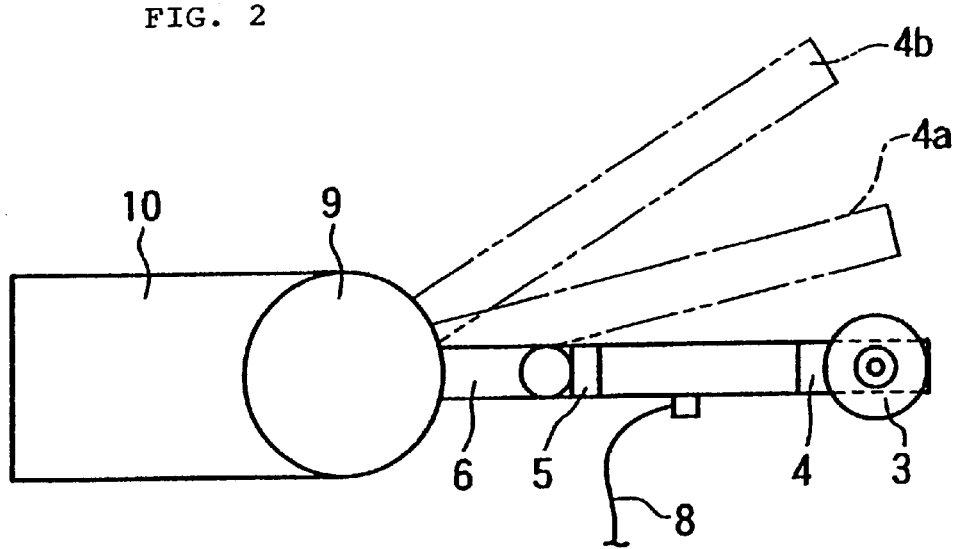
FIG. 2 is a top view of FIG. 1.

As seen from FIG. 2, the torch electrode 4 operated by the rotary motor 9 can take three (3) horizontal positions: a discharge position during bonding that is indicated by the solid line, a retracted position during bonding that is indicated by the one-dot chain line referred to by the reference numeral 4a, and a stopping position indicated by the two-dot chain line referred by the reference numeral 4b.

During the ball formation process, the rotary motor 9 rotates, and the torch electrode 4 connected to the output shaft 9a of the rotary motor 9 via the torch electrode holding member 6 is pivoted about the output shaft 9a and moved from the retracted position indicated by the one-dot chain line 4a to a position beneath the tail 1a of the wire extending from the tip end of the capillary 3 as indicated by the solid line. Then, a discharge is performed on the tip end of the tail 1a of the wire 1 by the torch electrode 4, thus forming a ball 1b on the wire 1. Afterward, the rotary motor 9 rotates in reverse, and the torch electrode 4 is returned to the retracted position indicated by the one-dot chain line 4a.

Thus, since the torch electrode 4 is operated directly by way of the rotation of the rotary motor 9, the stopping position of the torch electrode 4 can be freely selected. Accordingly, there is no need for providing a stopper such as the one used in conventional systems, and the system operates quietly. Furthermore, since the torch electrode 4 is directly driven by the output shaft 9a of the rotary motor 9, the system can operate at a high speed. Moreover, the degree of freedom of the range of movement of torch electrode 4 is high, and the torch electrode 4 can be brought to any desired position. Thus, when for instance the wire is to be inserted into and passed through the capillary 3 and also when the capillary is replaced, the rotary motor 9 is driven so that the torch electrode 4 is brought to a position away from the capillary 3 as indicated by the two-dot chain line 4*b*. In other words, the torch electrode 4 does not become an obstruction of various operation, providing superior working characteristics for, for example, wire passing and capillary replacement.

As described above, a high voltage is applied to the torch electrode 4. Accordingly, when the rotary motor 9 is connected to the torch electrode 4 as described above, it is necessary to install an insulating member between the output shaft 9*a* of the rotary motor 9 and the torch electrode 4. Accordingly, in the above embodiment, the torch electrode holding member 6 is fastened to the output shaft 9*a*, and the torch electrode 4 is connected to this torch electrode holding member 6 with the insulating member 5 in between. In other words, the torch electrode 4 is fastened to the torch electrode holding member 6 via the insulating member 5 so that the torch electrode 4 and the torch electrode holding member 6 form an integral unit. A direct connection of the torch electrode 4 to the rotary motor 9 is thus obtained.

Figure 3:
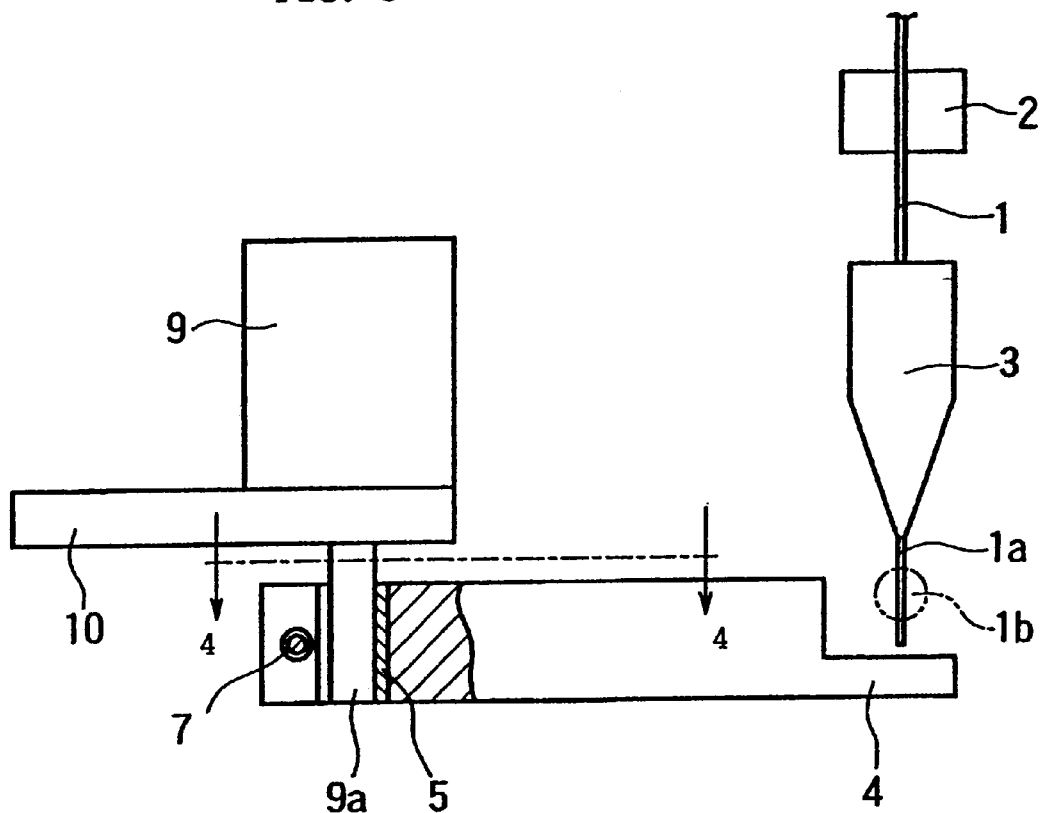
FIG. 3 is a partially sectional front view of another embodiment of the wire bonding apparatus of the present invention.
Figure 4:
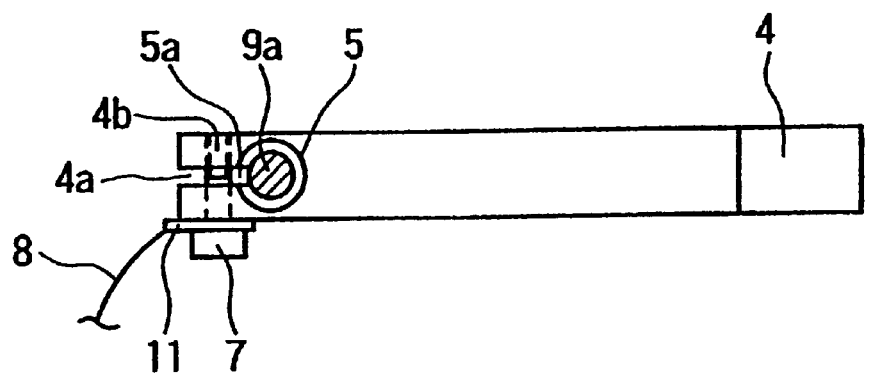
FIG. 4 is a sectional view taken along the line 4—4 in FIG. 3.

FIGS. 3 and 4 illustrate another embodiment of the present invention for a direct operation of the torch electrode 4 by the rotary motor 9. Constituting elements which are the same as or correspond to those in the previous embodiment will be referred to using the same reference symbols.

In this embodiment shown in FIGS. 3 and 4, a ring-form insulating member 5 in which a split groove 5*a* is formed is installed on the output shaft 9*a* of the rotary motor 9, and the torch electrode 4 is fastened to the output shaft 9*a* by a fastening screw 7 with this insulating member 5 in between. More specifically, a split groove 4*a* is formed in the torch electrode 4, and a threaded part 4*b* is provided near this split groove 4*a* so that the fastening screw 7 screw-engages with the threaded part 4*b* in order to tighten the split groove 4*a*. A ring-form terminal 11 to which the high-voltage output line 8 is attached is passed through the fastening screw 7, and the fastening screw 7 is tightened in the threaded part 4*b* of the torch electrode 4. As a result, the torch electrode 4 is fastened to the output shaft 9*a* of the rotary motor 9 with the insulating member 5 in between. Substantially the same advantage as in above-described embodiment shown in FIGS. 1 and 2 is obtained by this construction as well.

In the above-described embodiments, the torch electrode 4 is directly operated by the output shaft 9*a* of the rotary motor 9. However, the torch electrode 4 can be arranged so as to be driven by the rotary motor 9 via a linkage, belt, gears, etc. Nonetheless, when the output shaft 9*a* of the rotary motor 9 is arranged so as to directly operate the torch electrode 4 as in the shown embodiments, the number of parts required is reduced, the cost of the apparatus is reduced, and the useful life can be extended.

As seen from the above, according to the present invention, the torch electrode is driven by a rotary motor. Accordingly, the present invention provides a quiet operation, high degree of freedom of the range of movement of the torch electrode, and superior working characteristics; and it further provides high-speed operation. Also, since the rotary motor directly operates the torch electrode, the number of parts required is reduced, assuring a low cost and an extended useful life.

What is claimed is:

1. A wire bonding apparatus comprising a capillary through which a wire passes, a torch electrode which is installed so as to make substantially a horizontal movement and to be positioned beneath said capillary, and a torch electrode driving means which drives said torch electrode, wherein said torch electrode driving means consists of a rotary motor.

2. The wire bonding apparatus according to claim 1, wherein said torch electrode is directly operated by said rotary motor so as to make said horizontal movement.

3. The wire bonding apparatus according to claim 1, wherein said torch electrode is connected to an output shaft of said rotary motor with an insulating member in between.

\* \* \* \* \*